United States Patent [19]
Yamagishi

[11] Patent Number: 5,800,194
[45] Date of Patent: Sep. 1, 1998

[54] IC SOCKET

[75] Inventor: Hiroki Yamagishi, Kawaguchi, Japan

[73] Assignee: Enplas Corporation, Kawaguchi, Japan

[21] Appl. No.: 719,538

[22] Filed: Sep. 25, 1996

[30] Foreign Application Priority Data

Sep. 25, 1995 [JP] Japan ................. 7-246129

[51] Int. Cl.[6] ................................. H01R 11/22
[52] U.S. Cl. ........................... 439/266; 439/264
[58] Field of Search ....................... 439/266, 264, 439/268, 259, 261, 263

[56] References Cited

U.S. PATENT DOCUMENTS

| | | | |
|---|---|---|---|
| 5,186,642 | 2/1993 | Matsuoka et al. | 439/268 |
| 5,320,550 | 6/1994 | Uratsuji et al. | 439/266 |
| 5,669,780 | 9/1997 | Fukunaga | 439/266 |
| 5,690,281 | 11/1997 | Ikeya et al. | 439/268 |

FOREIGN PATENT DOCUMENTS 6-30280  4/1994  Japan.

Primary Examiner—Neil Abrams
Assistant Examiner—Tho Dac Ta
Attorney, Agent, or Firm—Cushman Darby & Cushman IP Group of Pillsbury Madison & Sutro LLP

[57] ABSTRACT

An IC socket includes a cover member vertically movable; a mounting device for placing an IC package; a slide member having a plurality of contact pins inserted therein, horizontally movable; an operating member reciprocating in accordance with the vertical movement of the cover member; and a position control device coming in contact with the slide member to press and move the slide member in a direction perpendicular to the contact surface and to enable the slide member to regain its original position. Thus, the connecting terminals of the IC package are wiped at a moderate contact pressure, and the IC socket having excellent conducting properties can be provided.

22 Claims, 12 Drawing Sheets

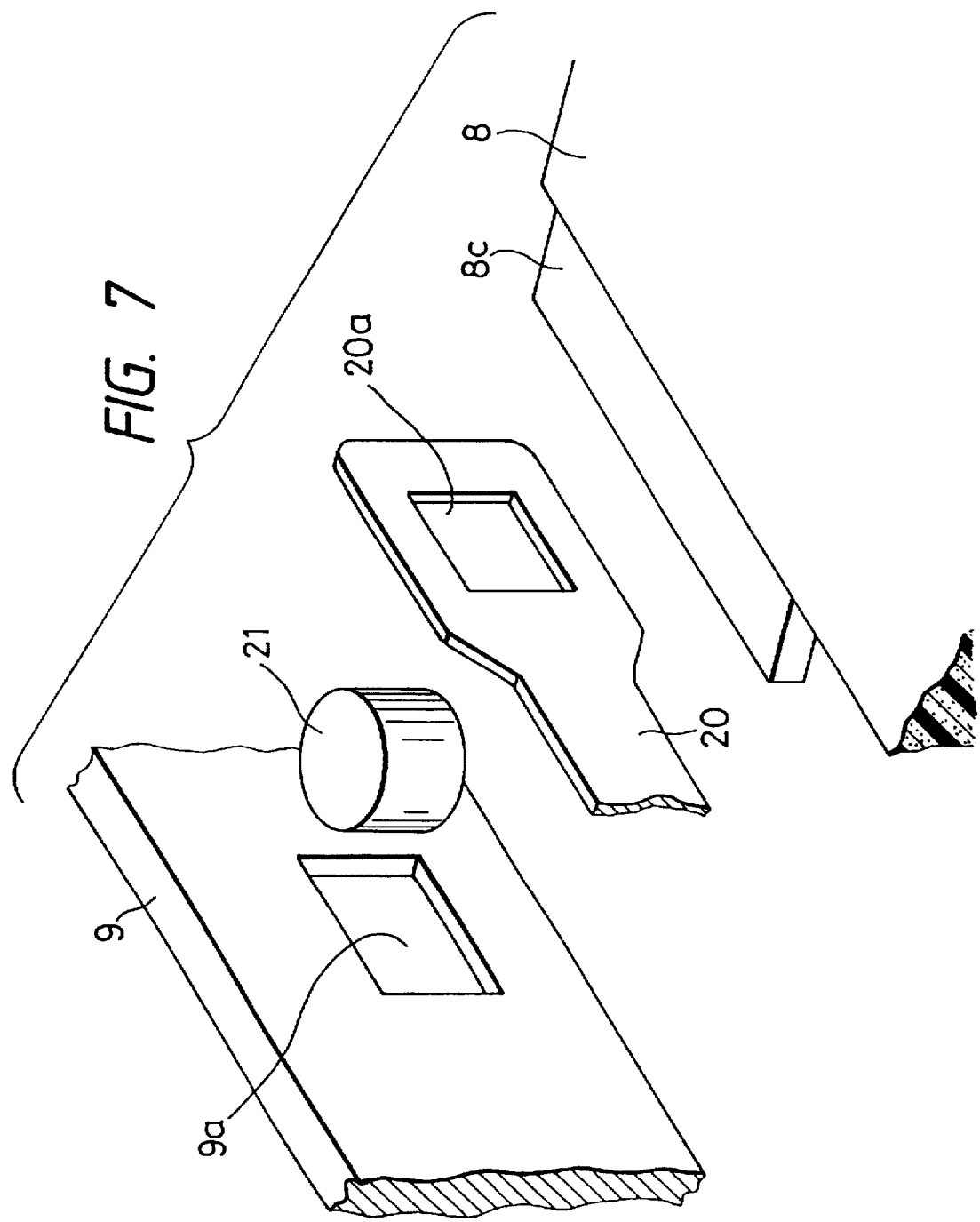

IC SOCKET

BACKGROUND OF THE INVENTION

1. Field of the Invention

This invention relates to an IC socket for testing IC packages containing ICs, LSIs, etc.

2. Description of Related Art

IC packages fall roughly into two main groups, one provided with connecting terminals located so as to protrude from the side faces of the package and the other provided with those located on the underside (at the bottom) thereof. IC sockets suitable for the latter IC packages are known in which a slide member with an array of a plurality of holes for inserting contact pins is situated in the lower portion of the place where the IC package is mounted, and is moved horizontally or vertically in association with the vertical movement of a cover member, thereby bringing the contact pins into contact with, or separating them from, the connecting terminals of the IC package. Of these, an IC socket designed so that the slide member is moved in a horizontal direction through a lever, link, or cam mechanism is set forth, for example, in Japanese Patent Publication No. Hei 6-30280.

The slide member of the IC socket of this type has a plurality of holes in which the contact pins are inserted, so that when the cover member is pressed down, each of the contact pins is pushed against its resilience by the edge or wall of each of the holes to provide a mouth of sufficient space for inserting each of the connecting terminals, and when the downward pressure of the cover member is released after the connecting terminal is inserted, the contact pin is moved to follow one direction until it comes in contact with the connecting terminal.

With the structure of such an IC socket, it is extremely difficult that the operation of the slide member is stopped so that it is located at a predetermined position, because when the cover member is pressed down, the slide member is operated through the lever mechanism or the like, as mentioned above. This is due not only to the manufacturing problem of the IC socket, but also to the fact that it is difficult that when the cover member is pressed down, for example, by a mechanical device, the cover member is always maintained in a horizontal position and at the same time, is surely moved vertically. Furthermore, if the amount of movement of the slide member is small, the mouth mentioned above will be small and each connecting terminal ceases to be smoothly insertable. Conversely, if the amount of movement is larger, each contact pin will be unnecessarily flexed, with the result that the contact pin develops a resilient defect or is brought into contact with adjacent contact pins, depending on the configuration of the contact pin. Thus, to avoid such difficulties, conventional products have been obtained in such a way that the working accuracy of parts is improved or assembly adjustments are carefully made.

SUMMARY OF THE INVENTION

It is, therefore, an object of the present invention to provide an IC socket in which an operating member is placed at a position adjacent to each side face of a slide member so that the operating member is moved horizontally or vertically along the side face of the slide member, and thereby the slide member is surely moved by a predetermined amount in a direction perpendicular to the side face thereof.

In order to achieve this object, the IC socket of the present invention includes: a cover member having an opening for inserting an IC package, mounted to be vertically movable with respect to a socket body; mounting means for placing the IC package, fixed to the socket body; a slide member of nearly rectangular shape having a plurality of holes in which contact pins are inserted, placed to be horizontally movable on the underside of the mounting means; an operating member located on at least one of a set of parallel side faces of the slide member, reciprocating in a plane nearly parallel to the side face in accordance with the vertical movement of the cover member; and position control means coming in contact with at least one of the set of parallel side faces of the slide member, moved in a direction perpendicular to the side face by the operating member in one stroke of the reciprocation of the operating member to press and move the slide member in the direction perpendicular to the side face, and releasing the pressure from the slide member in the other stroke to enable the slide member to regain its original position.

According to the present invention, the IC socket is such that the operating member and the position control means are located on each of the set of parallel side faces of the slide member so that a forward motion of the reciprocation of one operating member placed on one side face of the slide member causes one position control means placed on the same side face to press and move the slide member in the direction perpendicular to the side face, while a backward motion of the reciprocation of the other operating member placed on the other side face causes the other position control means placed on the same side face to push back the slide member in the direction perpendicular to the side face.

Further, according to the present invention, the IC socket is such that the operating member reciprocating horizontally in accordance with the vertical movement of the cover member and the position control means are placed on at least one of the set of parallel side faces of the slide member, and another operating member reciprocating vertically in accordance with the vertical movement of the cover member and another position control means are placed on at least one of another set of parallel side faces of the slide member.

Still further, according to the present invention, the IC socket is such that the operating member reciprocating vertically in accordance with the vertical movement of the cover member and the position control means are placed on at least one of a set of parallel side faces of the slide member, and another operating member reciprocating vertically in accordance with the vertical movement of the cover member and another position control means are placed on at least one of another set of parallel side faces of the slide member.

According to the present invention, the IC socket is such that the operating member reciprocating horizontally is held by a shaft disposed so that its axis is nearly parallel to the plane of the slide member and perpendicular to the direction of movement of the operating member, and after the downward movement of the cover member causes the position control means to press and move the slide member in a direction perpendicular to the side face, the shaft is moved to push the slide member in the direction of movement of the shaft.

According to the present invention, the IC socket is equipped with a pair of first links mounted to be rotatable, at one end of each link, on both side faces of the socket body parallel to the direction of movement of the operating member reciprocating horizontally, a pair of second links mounted to be rotatable, at one end of each link, to both ends of the shaft, and another shaft placed parallel to the former shaft so that the other end of each of the first links and the other end of each of the second links are mounted to be rotatable at each of both ends of the latter shaft, which is operated in accordance with the vertical movement of the cover member.

Further, according to the present invention, the IC socket is such that the surface of the position control means coming in contact with the side face of the slide member is shaped into an arc or spherical form.

This and other objects as well as the features and advantages of the present invention will become apparent from the following detailed description of the preferred embodiments when taken in conjunction with the accompanying drawings.

BRIEF DESCRIPTION OF THE DRAWINGS

FIG. 7 is a view for explaining essential parts of FIG. 4;

DETAILED DESCRIPTION OF THE PREFERRED EMBODIMENTS

The present invention will be explained in reference to the following three embodiments which are different in structure. Each embodiment shows an open top type IC socket for testing the IC package which is referred to as a ball grid array (hereinafter abbreviated to BGA). Its structure and function are applicable to each embodiment in common.

First embodiment

This embodiment is designed so that a direct operating mechanism of a slide plate is operated nearly parallel to the plane of the slide plate.

Figure 1:
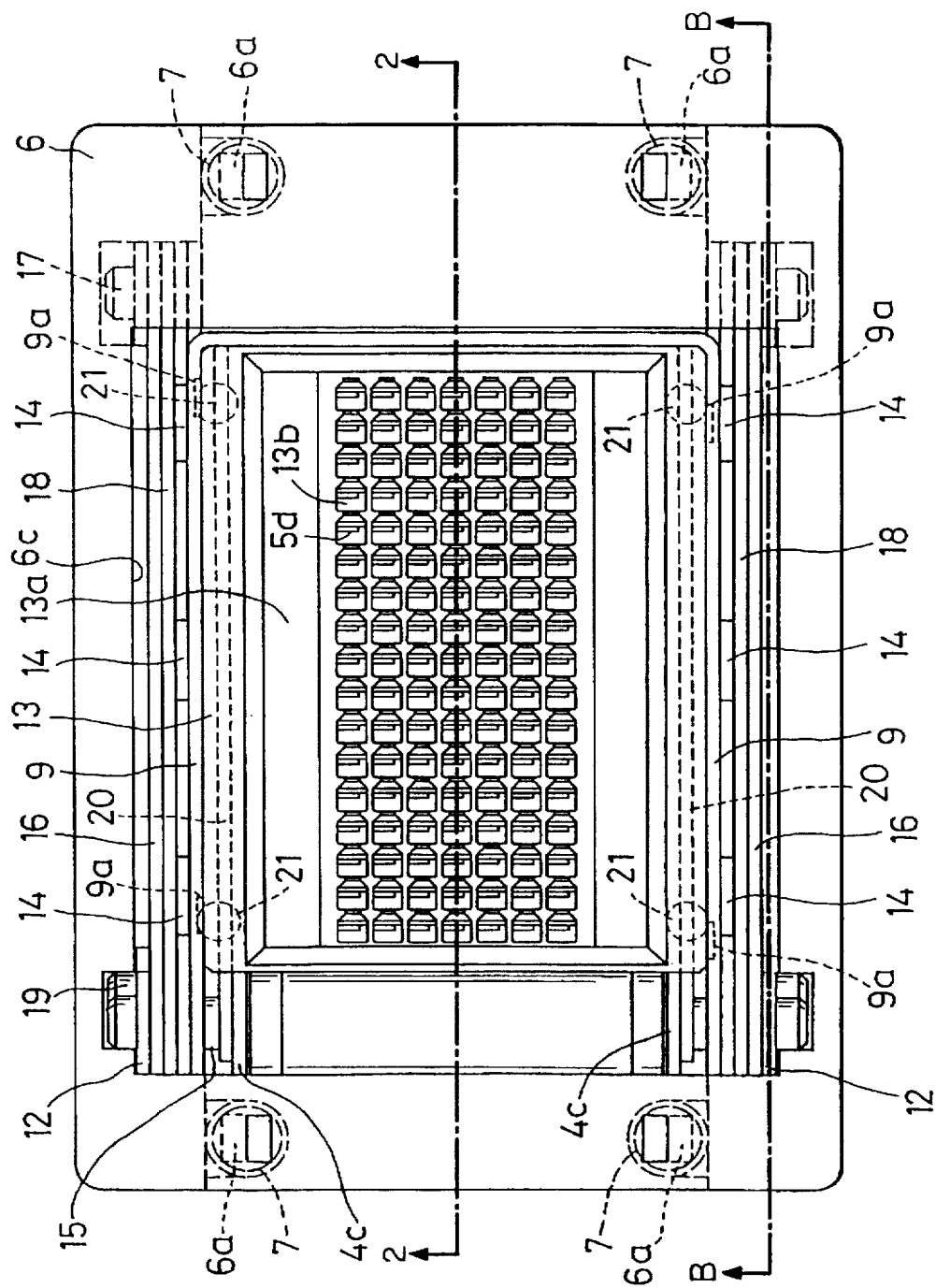
FIG. 1 is a plan view showing the structure of a first embodiment of the IC socket according to the present invention.
Figure 2:
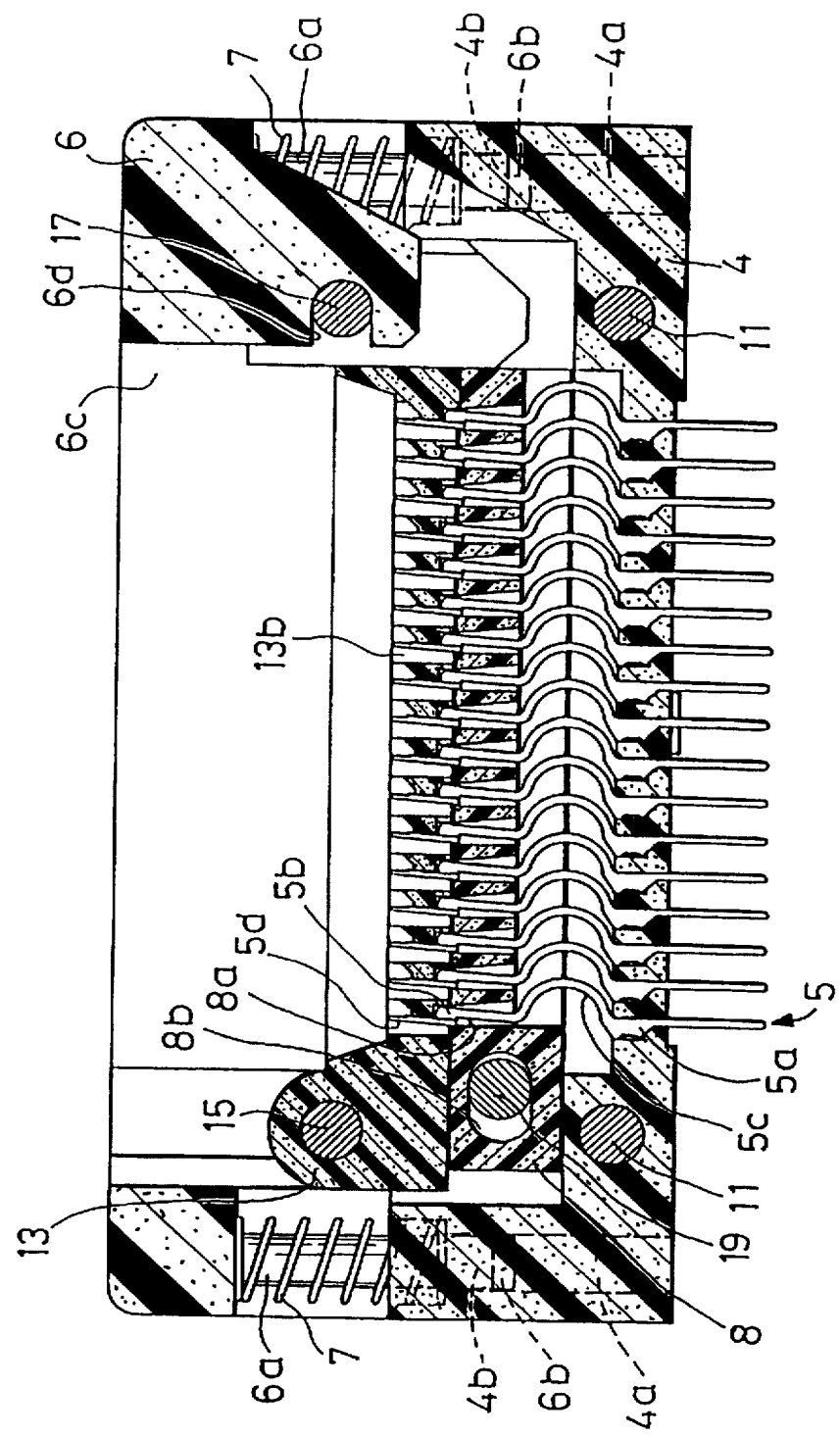
FIG. 2 is a sectional view taken along line A—A in FIG. 1.

At the beginning, the structure of the IC socket of the first embodiment will be explained. As shown in FIGS. 1 and 2, contact pins 5 arranged in lateral rows, each with 17 pins, are incorporated, by a force fit, in a socket body 4 made of synthetic resin. Each of the contact pins 5 is such that a spring portion 5c is configured between a base portion 5a forcedly fitted and a free end 5b, and a contact portion 5d bent at an angle of about 90° is configured at the tip of the free end 5b. The contact pins thus constructed are actually arranged in seven rows in the socket body 4.

Figure 3:
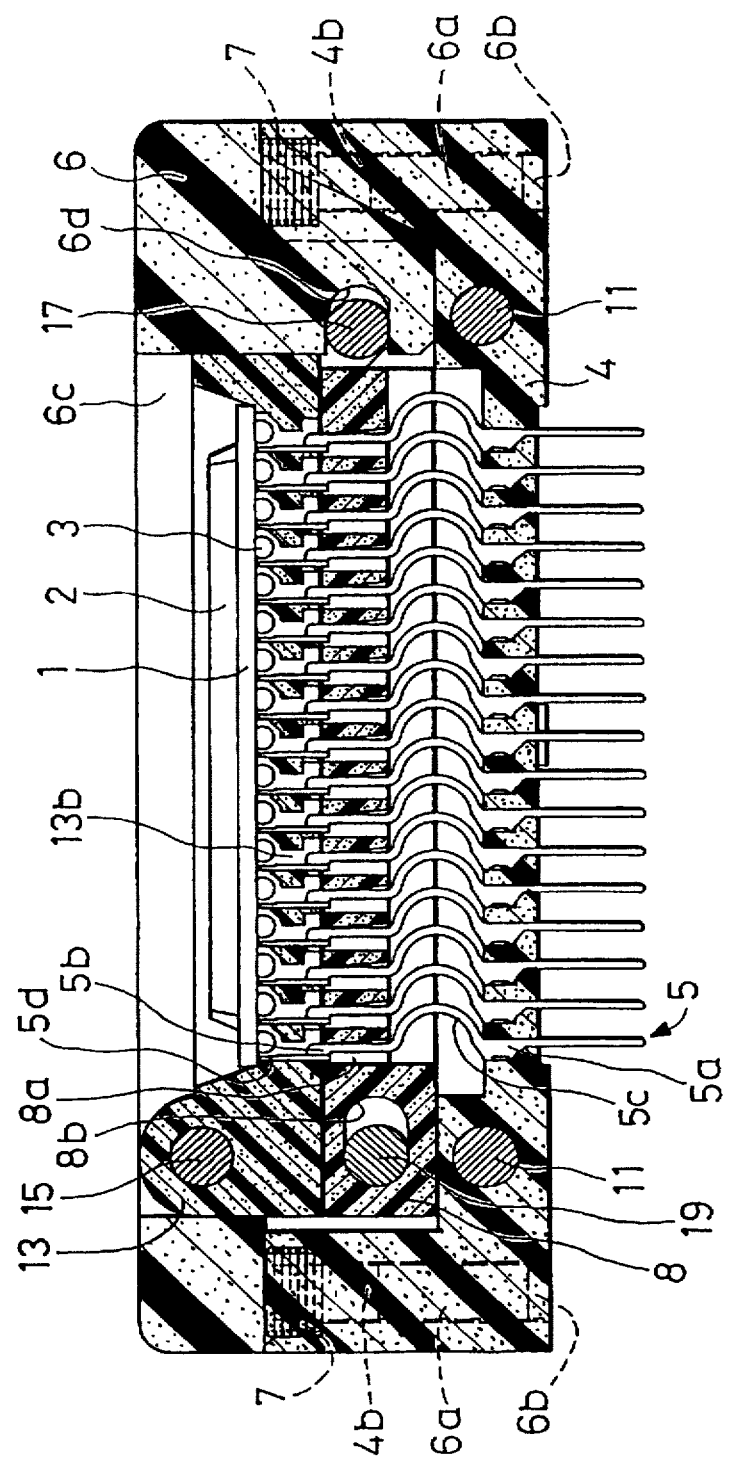
FIG. 3 a sectional view, taken along line A—A in FIG. 1, showing a case where a cover member is pressed down and a ball grid array is placed in the IC socket.

Here, reference is briefly made to the BGA, although well known, loaded onto the IC socket of the first embodiment. The BGA viewed from the side is shown in FIG. 3, and that used in the first embodiment is designed so that an IC body 2 is mounted on the upper side of a substrate 1, and a plurality of solder balls 3, each having a practically spherical shape with a diameter of about 0.75 mm, are arranged as connecting terminals on the lower side. These solder balls 3 are arranged in 7 rows, each including 17 balls.

Figure 4:
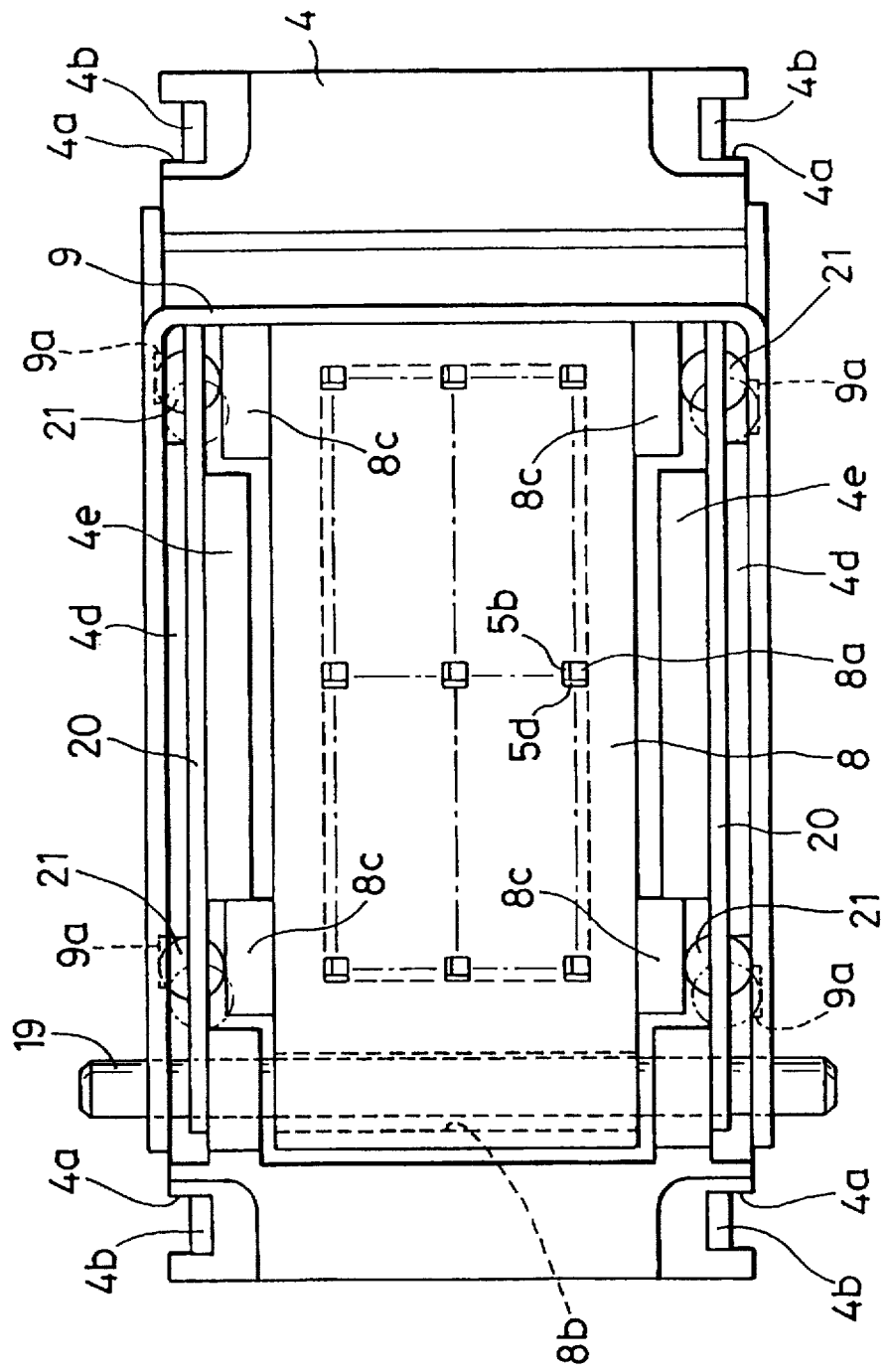
FIG. 4 is a plan view showing a structure for operating a slid plate in the first embodiment.

A cover member 6 constructed of synthetic resin, as seen from FIG. 1, assumes a rectangular shape and is mounted to be movable in a vertical direction with respect to the socket body 4 having a planar shape such as that shown in FIG. 4. Specifically, four flexible hook portions 6a of well known shape, each winding a coil spring 7 therearound, are constructed integral with the cover member 6 in its lower portion. Hence, the cover member 6 is normally biased upwardly by the coil springs 7, but a pawl portion 6b shaped into a claw-like form at the top of each hook portion 6a engages with an engaging portion 4b in a channel 4a of U-shaped cross section constructed in the socket body 4, thereby restricting the position of the upper limit of the cover member 6. Furthermore, the cover member 6 has a nearly rectangular opening 6c for inserting the BGA.

On the socket body 4, as shown In FIG. 2, a slide plate 8 made of synthetic resin is mounted to be movable in a horizontal direction. The free end 5b of each contact pin 5 is inserted in each of holes 8a bored through the slide plate 8, projecting the contact portion 5d upwardly. Further, in FIG. 2, the slide plate 8 has a slot 8b which is laterally elongated. Still further, as shown in FIG. 4, the slide plate 8 has four tabs 8c protruding sideways from the rectangular body in which the holes 8a are bored.

Figure 5:
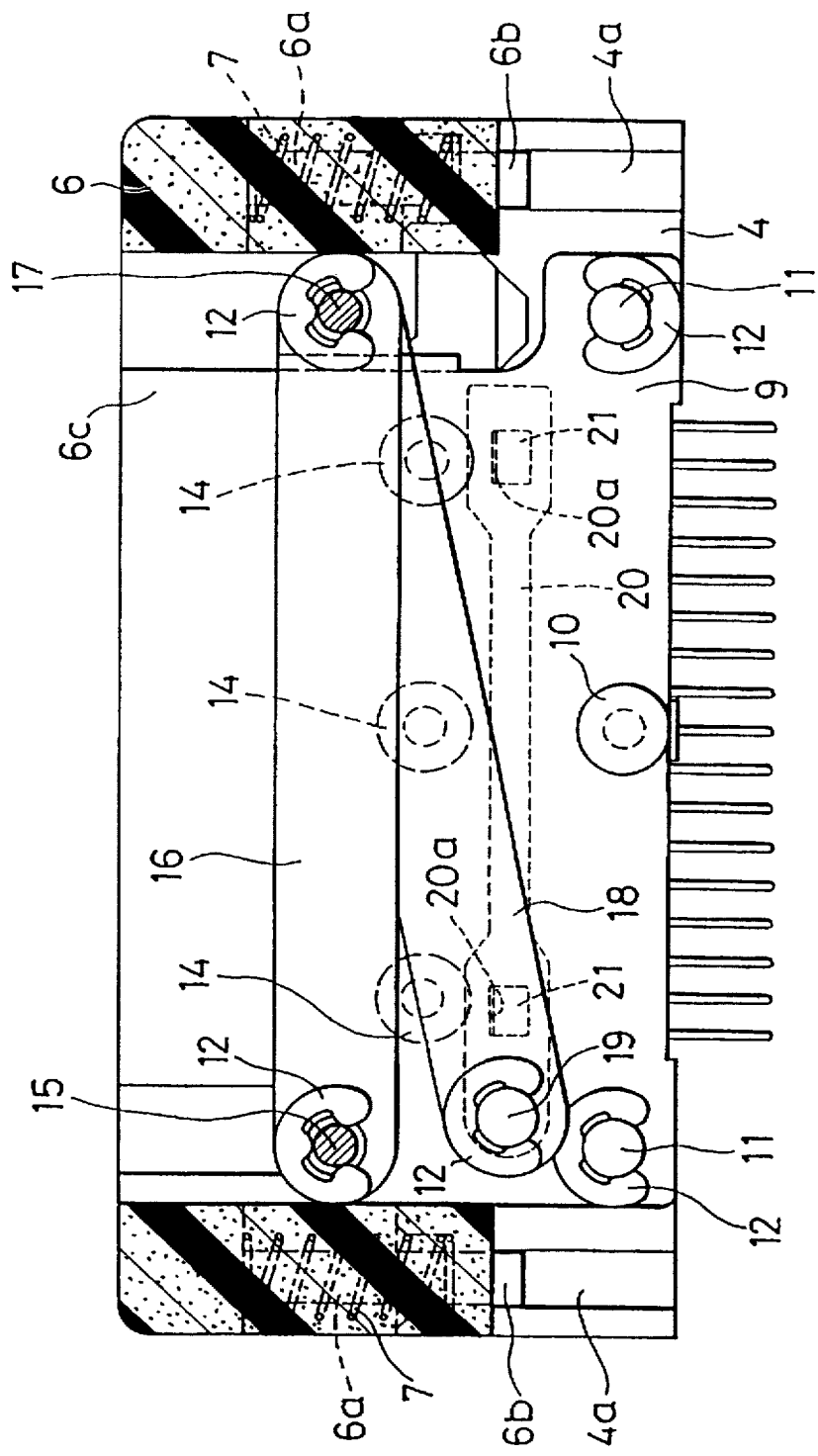
FIG. 5 is sectional view taken along line B—B in FIG. 1.
Figure 6:
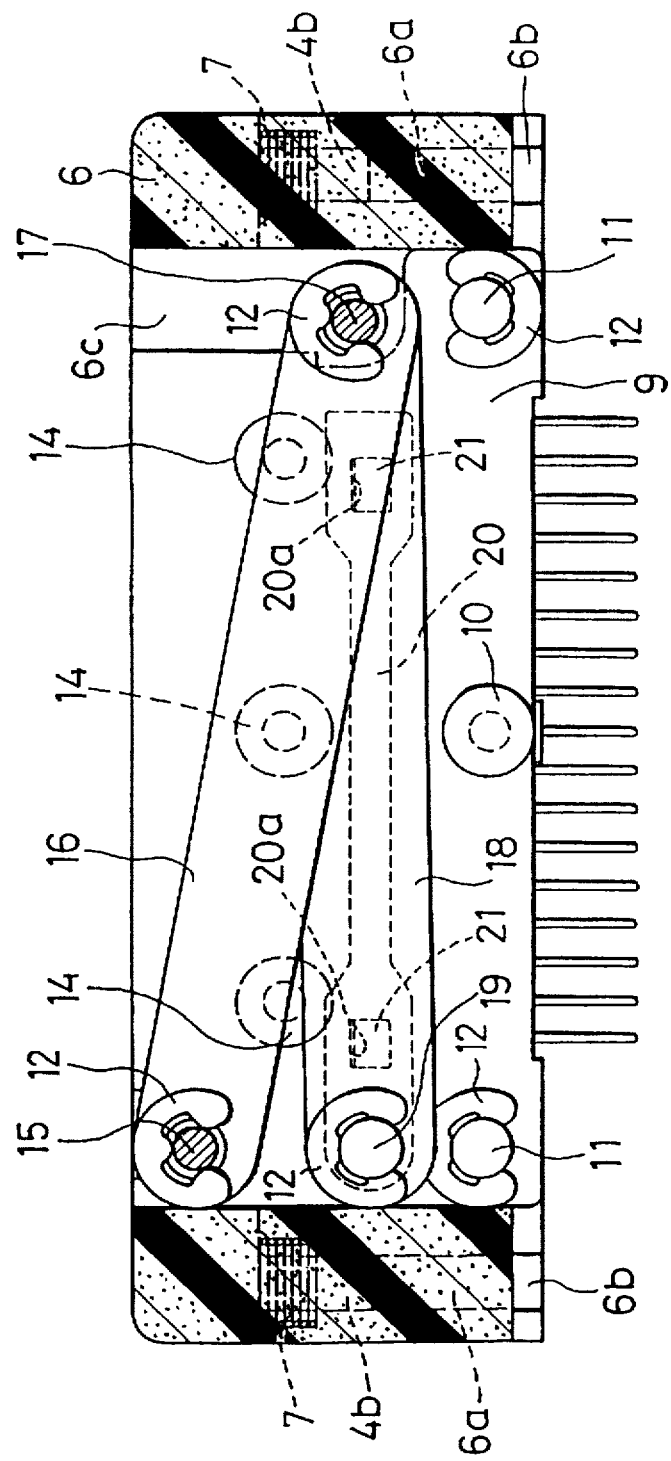
FIG. 6 is a sectional view, taken along line B—B in FIG. 1, showing a case where the cover member is pressed down.

As shown In FIGS. 1 and 4, a metallic reinforcing plate 9 shaped into a U-like form when viewed from above is mounted to the socket body 4. Its mounting, as shown in FIGS. 5 and 6, is performed at three places along the lower portion of each side. Of these places, a middle portion is fixed to each side face of socket body 4 by a forced pin 10. In contrast to this, each of remaining two portions is such that a shaft 11 pierces through the socket body 4 and the reinforcing plate 9 located on both sides of the socket body 4, and the outward movement of the shaft 11 is prevented by an E ring 12 provided at each end of the shaft 11. The reinforcing plate 9, as shown in FIGS. 1, 4, and 7, has four recesses 9a. Also, a rivet, instead of the shaft 11, may be inserted in a hole from one side face of the plate 9 so that its tip piercing through the other side face is spread for fastening.

As obvious from FIGS. 2 and 3, a rectangular fixed plate 13 made of synthetic resin is placed on the slide plate 8 so that the slide plate 8 can be moved in a horizontal direction between the fixed plate 13 and the socket body 4. The fixed plate 13, as illustrated in FIGS. 1, 5, and 6, is fastened by three forced pins 14 on each side face of the reinforcing plate 9. In the upper portion of the fixed plate 13, as seen from FIGS. 1 and 3, a rectangular recess is provided as a mounting portion 13a for the BGA, and the contact portions 5d of the contact pins 5 are inserted in holes 13b which are pierced vertically and arranged longitudinally and laterally.

The fixed plate 13 is fitted with a shaft 15 whose both ends, as shown in FIG. 1, penetrate lugs 4c and the reinforcing plate 9 which are attached to the socket body 4. One end of each of first link bars 16 is mounted to be rotatable to each end of the shaft 15 and is prevented by the E ring 12 from moving outwardly. The cover member 6, as shown in FIGS. 2 and 3, is provided with a hole 6d which is laterally elongated and opened at its one end and into which a shaft 17 is fitted. The other end of each of the first link bars 16 and one end of each of second link bars 18 are rotatably mounted to each end of the shaft 17 and are prevented by the E ring 12 from moving outwardly. Also, the hole 6d may be bored like the slot 8b of the slide plate 8.

A shaft 19 is fitted into the slot 8b of the slide plate 8. The other end of each of the second link bars 18 is rotatably mounted to each end of the shaft 19 and is prevented by the E ring 12 from moving outwardly. As shown in FIGS. 1 and 4, each of two slide bars 20 is mounted to be rotatable at its one end to the shaft 19. Each slide bar 20, as seen from FIGS. 5 and 6, is shaped into a dumbbell-like form as a whole and has two holes 20a, one at a position close to each end of the bar.

As is obvious from FIG. 7, a cylindrical rotator 21 is put in each hole 20a and sandwiched between the tab 8c of the slide plate 8 and the reinforcing plate 9 at the assembly stage. As will be understood from the explanation of operation described later, the rotator 21 may be spherical in shape, not to speak of the cylindrical form, and may also have a plate-like or columnar form with its contact surface as an arc or sphere if the rotator can be moved perpendicular to the direction of movement of the slide bar 20. In an extreme case, the contact surface may be planar unless the movement of the slide bar 20 is impeded.

Each recess 9a of the reinforcing plate 9 may, of course, be designed so that not only is a necessary place hollowed, but also this recess is extended in a vertical direction of FIG. 7. As shown in FIG. 5, the slide bar 20 needs to be always held in a nearly horizontal position. In the first embodiment, therefore, the lower surface of the right-hand end of the slide bar 20 is supported by a part of the socket body 4 to maintain the horizontal position. Furthermore, as seen from FIG. 4, the slide bar 20 is sandwiched between guides 4d and 4e of the socket body 4, and thus the lateral movement of the slide bar 20 in this figure is stabilized.

As may be understood from the above description, the shaft 15 cannot be moved with respect to the socket body 4, while for the shafts 17 and 19, it is possible to do so. In view of the above construction, each of the shafts 15, 17, and 19 may be divided, into two shaft components. Although, for example, the shaft 15 is constructed as a single shaft in view of a reduction in the number of parts, a cut in assembly hour, and strength after assembly, it may also be divided into two components so that they are mounted to the reinforcing plate 9.

Figure 8A:
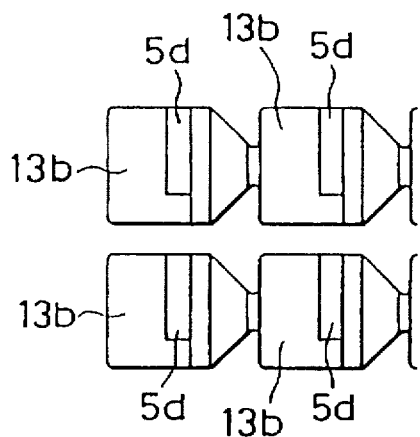
FIGS. 8A, 8B, 8C, 8D, 8E, and 8F are views for explaining the loading process of the ball grid array in the first embodiment.

Next, a description will be given of the loading operation of the BGA in the IC socket constructed mentioned above. FIGS. 1, 2, 4, and 5 show cases where the BGA is not loaded. The slide plate 8 is pushed by the resilience of the contact pins 5 and is situated at the right-hand end. In this case, as shown in FIG. 4, two rotators 21 held by the upper slide bar 20 fall in the recesses 9a of the reinforcing plate 9 and comes in contact with the tabs 8c of the slide plate 8 and the recesses 9a. On the other hand, the remaining two rotators 21 held by the lower slide bar 20 fail to fall in the recesses 9a and are in contact with the tabs 8c of the slide plate 8 and the inner face of the reinforcing plate 9. In this case, the-positions of the contact portions 5d of the contact pins 5 in the holes 13b of the fixed plate 13 are shown in FIG. 8A.

When the cover member 6 is pressed down, from this state, against the resilience of the coil springs 7 by a mechanical device or the like, the shaft 17 is lowered progressively with reference to FIGS. 2 and 3. At this time, the first link bars 16 are rotated about the shaft 15 and thus, from the state of FIG. 2, the shaft 17 is moved in the leftward direction, simultaneously with its lowering operation, to push the shaft 19 to the left through the second link bars 18. Since, as shown in FIG. 2, clearance is provided between the slot 8b of the slide plate 8 and the shaft 19, the slide plate 8 is not moved at the initial stage of a leftward movement of the shaft 19, and only the two slide bars 20 are moved in the same direction.

Figure 8D:
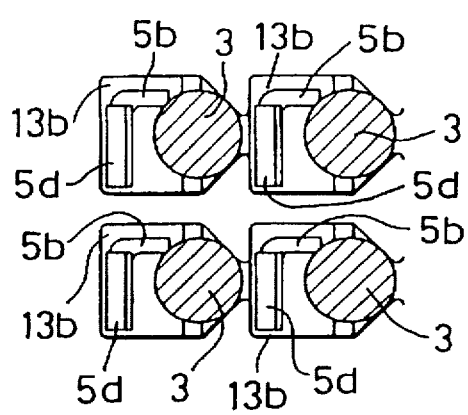
Figure 8B:
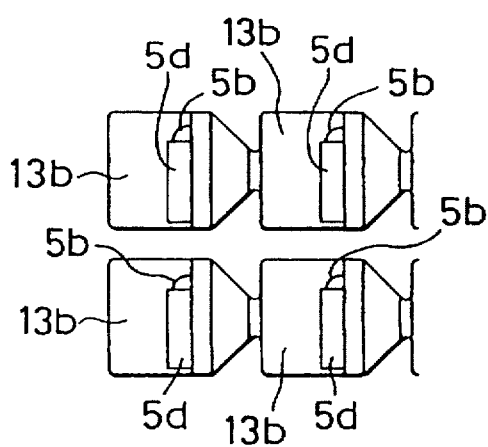

When the two slide bars 20 are thus moved leftwardly, as seen from the FIG. 4, the two rotators 21 held by the upper slide bar 20 slip out of the recesses 9a of the reinforcing plate 9, while the remaining two rotators 21 held by the lower slide bar 20 fall in the recesses 9a of the reinforcing plate 9. Hence, the slide plate 8 is slightly moved downwardly in the figure. In this case, since the free ends 5b of the contact pins 5 are pressed downwardly against their resilience by the inner walls of the holes 8a of the slide plate 8, the contact portions 5d in the holes 13b of the fixed plate 13 are positioned as shown in FIG. 8B.

When the cover member is further pressed down, in FIG. 2, the shaft 19 arrives at the left-hand end of the slot 8b to push and move the slide plate 8 leftwardly. In this way, the slide plate 8 urges the free ends 5b of the contact pins 5 against the resilience of the spring portions 5c through the inner walls of the holes 8a. The entire resilient bias force of a large number of contact pins 5 will be thus applied to the second link bars 18, but in the first embodiment, this force is imposed on the shaft 15 through the first link bars 16.

However, since the shaft 15 is supported by the metallic reinforcing plate 9 as mentioned above, the resilient bias force fails to act as that in a horizontal direction on the cover member 6, without adversely affecting the lowering operation of the cover member 6. In the first embodiment, if the first link bars 16 were absent, the resilient force would be exerted in an approximately rightward direction on the cover member 6 in FIG. 3. Consequently, the cover member 6 will be urged rightwardly and will require a stronger downward pressure.

Figure 8E:
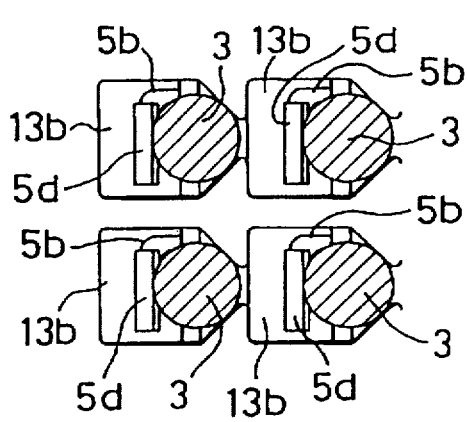
Figure 8C:
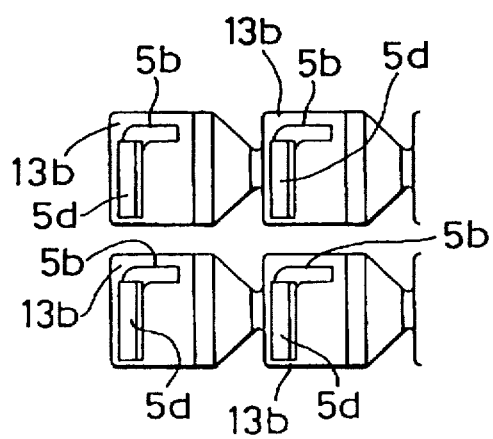

The case where the slide plate 8 is completely pushed leftwardly in this way is shown in FIGS. 3 and 6. The positions of the rotators 21 in this case are indicated by chain lines in FIG. 4, and the positions of the contact portions 5d in the holes 13b of the fixed plate 13 are shown in FIG. 8C. Subsequently, the BGA is inserted from the upper portion of the cover member 6 and is placed on the mounting portion 13a of the fixed plate 13. This state is shown in FIG. 3, and the positional relation in this state between each solder ball 3 of the BGA and each contact portion 5d is shown in FIG. 8D.

When the downward pressure of the cover member 6 by the mechanical device is released from the state of FIG. 3, the cover member 6 is raised by virtue of the resilience of the coil springs 7. In accordance with this operation, the shaft 17 is moved upwardly and rightwardly, and thus the shaft 19 is moved rightwardly. At the same time, the slide plate 8 is made to follow the movement of the shaft 19 by the resilient bias force of the contact pins 5 and is moved rightwardly. Subsequently, as shown in FIG. 8E, the contact portions 5d of the contact pins 5 come in contact with the solder balls 3 and cease to move. Thus, the resilient force of the contact pins 5 makes it possible to move the slide plate 8, and is set so that a moderate contact pressure is obtained that the solder balls 3 are kept in stable conduction and are not damaged.

In this way, even after the operation of the slide plate 8 is stopped, the cover member 6 continues to ascend. Thus, the shaft 19 is further moved rightwardly and stops at the position shown in FIGS. 2 and 4. In the final process of such operation of the shaft 19, as seen from FIG. 4, the two rotators 21 held by the upper slide bar 20 fall in the recesses 9a of the reinforcing plate 9, whereas the remaining two rotators 21 held by the lower slide bar 20 slip out of the recesses 9a of the reinforcing plate 9. As a result, the slide plate 8 is slightly moved upwardly.

In this case, the inner wall of each hole 8a of the slide plate 8 tends to separate from the free end 5b of each contact pin 5, and hence the free end 5b follows the movement of the inner wall in virtue of its own resilient bias force. Each contact portion 5d is shifted from each position of FIG. 8E to each position of FIG. 8F while wiping the surface of the solder ball 3 in the hole 13b of the fixed plate 13, and is stopped by the inner wall of the hole 13b. Thus, the solder ball 3 is such that its surface is favorably wiped by the contact portion 5d and is kept at the moderate contact pressure mentioned above. This shows a loading state of the BGA.

Figure 8F:
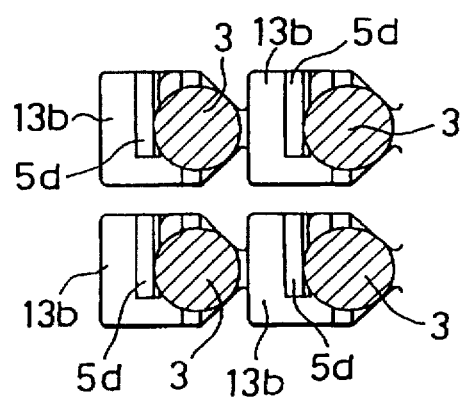

Also, in the case where the slide plate 8 is moved upwardly of FIG. 4, if the force of friction between each contact pin 5 and each solder ball 3, namely the force of a wiping action, is greater, it may be impossible that the slide plate 8 is restored only by the resilient bias force of each contact pin 5. In this case, the two rotators 21 held by the lower slide bar 20 serve to forcedly move and restore the slide plate 8 by their working pressure. If the slide plate 8 can be surely returned upwardly only by the resilient bias force of the contact pins 5, the lower slide bar 20 and the two rotators 21 held thereby will not necessarily be required.

Where the BGA is taken out from the IC socket after testing is performed in the loading state mentioned above, the cover member 6 is again pressed down by the mechanical device. When the cover member 6 is pressed down as shown in FIGS. 3 and 6, the positional relation between each contact portion 5d and each solder ball 3 is as shown in FIG. 8D, and thus the BGA can easily be removed from the IC socket, resulting in the state of FIG. 8C. In this state, when a new BGA is inserted, it is loaded as shown in FIGS. 8D to 8F. If the loading is not required, it is only necessary to reverse operational procedure in the order of FIGS. 8C, 8B, and 8A.

The first embodiment is constructed so that the slide plate 8 is moved in lateral and longitudinal directions in the same plane when the loading is operated, and thereby the contact pins 5 can also be moved in the same direction to perform the contact and wiping action relative to the solder balls 3. The present invention, however, is not limited to such a construction. Specifically, the present Invention is applicable to the construction that only the operation of contact of the contact pins 5 with the solder balls 3 is performed without the wiping action. In this case, in FIG. 4, for example, a wall on the left-hand side of the slot 8b is opened to assume a U-shaped cross section, or the slide plate 8 is cut off along a right-hand broken line of lines indicating the slot 8b in the figure, so that the slide plate 8 is not moved directly by the shaft 19 and the leftward movement of the slide plate 8 is restrained by proper means.

Furthermore, in the first embodiment, it is possible to eliminate the lower slide bar 20 shown in FIG. 4 and the corresponding two rotators 21. In this instance, there are two ways: one of completely omitting these components and the other, instead of using the two rotators 21, of using resilient bodies (spring, rubber or plastic resilient parts, or compound resilient material parts) such as to press the slide plate 8 upwardly of the figure. In the latter way, the resilient bodies may be provided on the side of either the slide plate 8 or the reinforcing plate 9 (namely, the socket body 4), or on both sides when occasion demands. Also, although the first embodiment has been explained as the IC socket for the BGA, the present invention is applicable to all the IC packages, including a pin grid array (PGA), which are constructed so that connecting terminals protrude downwardly from the IC body. This holds for the cases of other embodiments which will be described later.

Subsequently, reference is made to modification examples for the operating mechanism of the slide plate in the first embodiment, notably the mechanism for moving the slide plate 8 in the vertical direction of FIG. 4. FIGS. 9 to 14 show different modification examples. For simplicity, each of these figures provides only the structure which, of the four tabs 8c of the slide plate 8 shown in FIG. 4, is relative to the tab 8c located at the upper left in the figure. Like reference numerals indicate practically like parts and portions with the first embodiment. In the present invention, however, the four tabs 8c need not necessarily have the same structure, and it is possible to properly combine the structure of the first embodiment with any of modification examples described below. Also, such a structure is not limited to four places where the tabs 8c are mounted as in the first embodiment, and it is only necessary to place the tabs on both side of the slide plate 8 (on the upper and lower sides in FIG. 4), at least one on each side, in accordance with the planar configuration and size of the slide plate.

Figure 9:
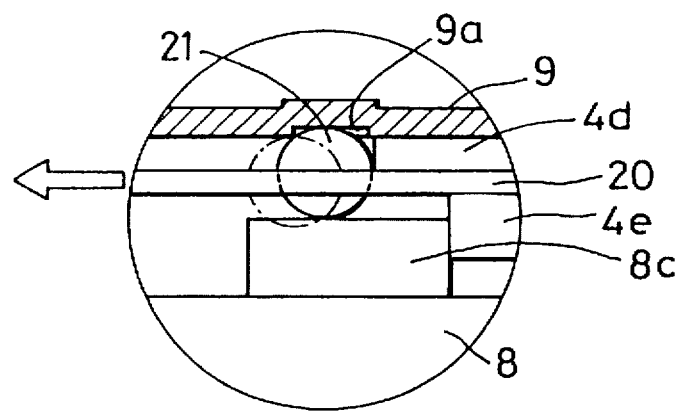
FIG. 9 is an explanatory view showing a first modification example of the operating mechanism of the slide plate in the first embodiment.

At the beginning, a first modification example illustrated in FIG. 9 is explained. In this figure, the reinforcing plate 9 is shown by a cross section. The rotator 21 is put in the hole 20a of the slide bar 20 as shown in FIG. 7, although, for simplicity, this state is not clearly seen from FIG. 9. The first modification example is the same as the first embodiment with the exception that the recess 9a of the reinforcing plate 9 is configured by the forming process of a press, for instance. Hence, a jog is provided on the opposite surface of the reinforcing plate 9. Where the reinforcing plate 9 is made of metal, there is the merit that working cost is relatively low. Also, the position of the rotator 21 where the slide bar 20 is moved in the direction of an arrow is indicated by a chain line.

Figure 10:
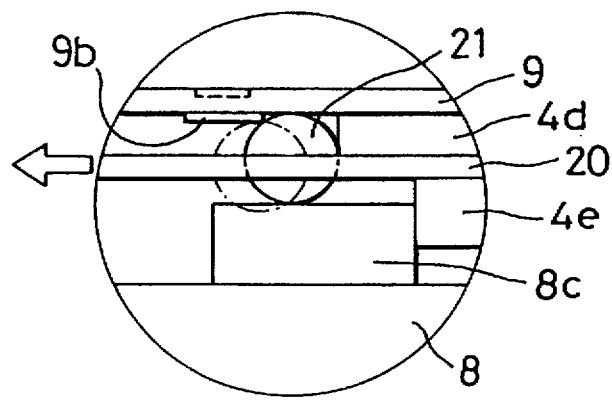
FIG. 10 is an explanatory view showing a second modification example of the operating mechanism of the slide plate in the first embodiment.

A second modification example shown in FIG. 10, in contrast to the first modification example, is designed so that a jog 9b is configured on the reverse side of the reinforcing plate 9 by the forming process. Thus, sufficient space for causing the rotator 21 to fall down the jog 9b is provided between the jog 9b and the guide 4d.

Figure 11:
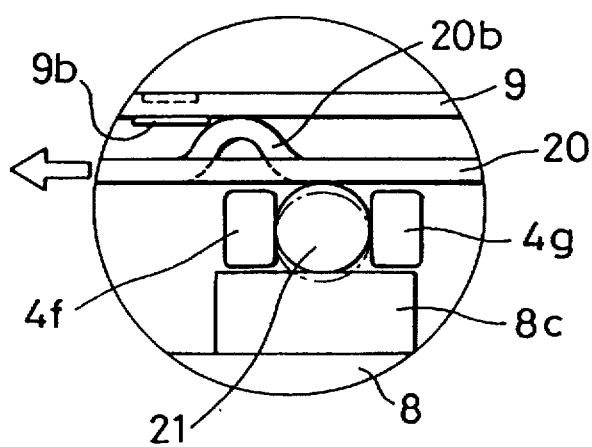
FIG. 11 is an explanatory view showing a third modification example of the operating mechanism of the slide plate in the first embodiment.

A third modification example shown in FIG. 11 is such that the reinforcing plate 9 shown in the second modification example is used and the relationship between the slide bar 20 and the rotator 21 is changed. Specifically, the slide bar 20 is deformed by press forming to have an arcuate protuberance 20b, instead of the hole 20a, so that the rotator 21 contacts the side face of the slide bar 20. Consequently, in this modification example, the slide bar 20 is moved in a vertical direction as well, in FIG. 11, and thus the guides 4d and 4e are not provided. Since, however, the position of the rotator 21 becomes unfixed, the socket body 4 is equipped with walls 4f and 4g to restrain the lateral movement of the rotator 21. In order to restrain the front-to-back movement of the rotator 21 in the figure, bridge-shaped plates may be mounted between the walls 4f and 4g, or a component into which these walls and plates are integrally constructed may be attached to the socket body 4. Moreover, if there is no problem of formability or workability, all the above parts may also be constructed integral with the socket body 4. It is needless to say that the reinforcing plate 9 having the recesses 9a is also applicable to this modification example.

Figure 12:
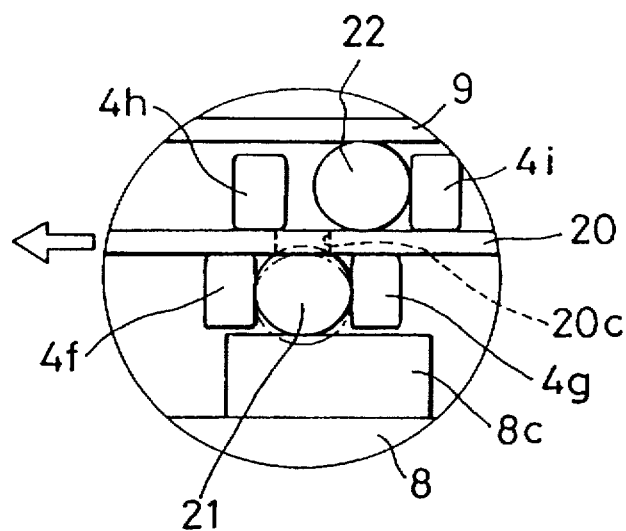
FIG. 12 is an explanatory view showing a fourth modification example of the operating mechanism of the slide plate in the first embodiment.

A fourth modification example shown in FIG. 12 provides the slide bar 20 with a hole 20c, instead of using the recess and jog in the reinforcing plate 9. Furthermore, another rotator 22 is interposed between the reinforcing plate 9 and the slide bar 20. The rotator 22 is provided with a view to smoothing the lateral movement of the slide bar 20. Therefore, if this smooth movement can be secured by other ways, the rotator 22 will be unnecessary. The movement of the rotator 22 is restrained by walls 4h and 4i provided on the socket body 4. The means for restraining the front-to-back movement of each of the rotators 21 and 22 in the figure is identical with the case of the rotator 21 to which reference has already been made in the third modification example. Also, instead of the hole 20c, a recess or jog may be configured on the surface of the slide bar 20 contacting the rotator 21.

Figure 13A:
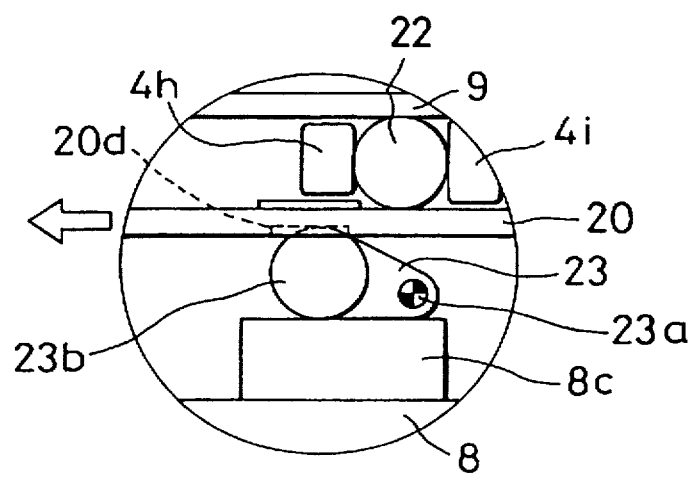
FIG. 13A is an explanatory view showing a fifth modification example of the operating mechanism of the slide plate in the first embodiment.
Figure 13B:
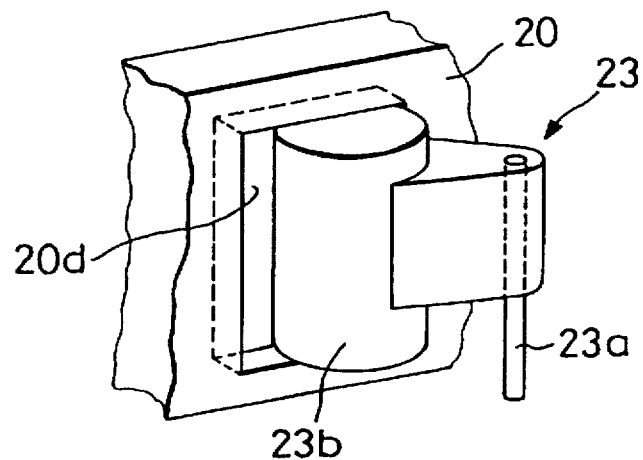
FIG. 13B is a perspective view showing essential parts of FIG. 13A.

A fifth modification example shown in FIGS. 13A and 13B is such that the slide bar 20 of the fourth modification example is configured with a recess 20d, instead of the hole 20c, and a swivel member 23 is provided instead of the rotator 21. The entire configuration of the swivel member 23 can be understood from FIG. 13B. The swivel member 23 is rotatably mounted through a support 23a to the socket body 4, and its columnar portion 23b is put in the recess 20d. Consequently, in FIG. 13A, when the slide bar 20 is moved in the direction of an arrow, the swivel member 23 is rotated counterclockwise about the support 23a so that the columnar portion 23b slips out of the recess 20d to push the slide plate 8 downwardly.

Figure 14:
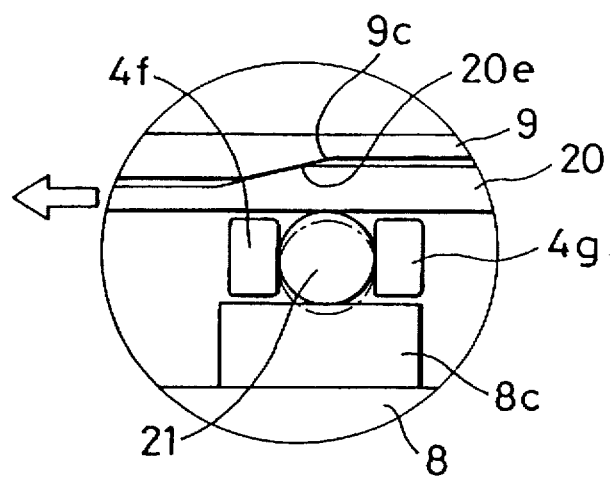
FIG. 14 is an explanatory view showing a sixth modification example of the operating mechanism of the slide plate in the first embodiment.

A sixth modification example shown in FIG. 14, relative to the third modification example shown in FIG. 11, is designed to configure a slope 9c, instead of the jog 9b of the reinforcing plate 9, and a slope 20e, instead of the protuberance 20b of the slide bar 20. When the slide bar 20 is thus moved in the direction of an arrow, it is also moved downwardly of the figure at the same time. In this case, although it is preferable that the reinforcing plate 9 is made of metal, it may be constructed of synthetic resin in view of the workability of the slope.

Figure 15:
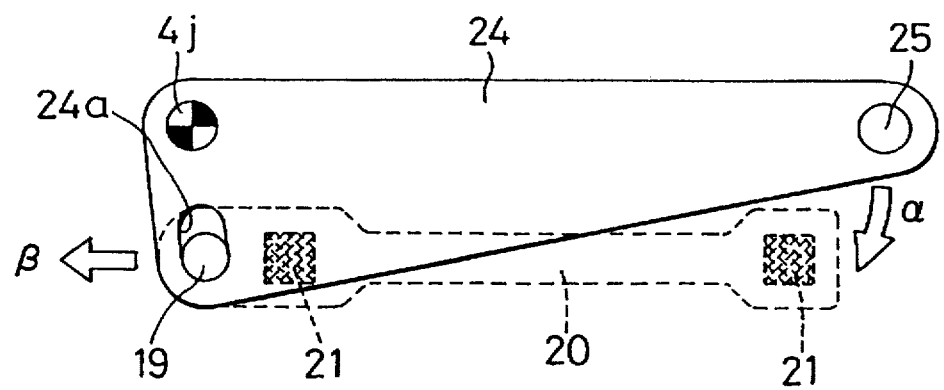
FIG. 15 is an explanatory view showing one modification example of the loading operation mechanism of an IC package in the first embodiment.

Next, one modification example of the loading operation mechanism of the IC package will be explained with reference to FIGS. 15 and 16. The modification example illustrated in FIG. 15 is popularly termed a lever system, in which a lever 24 is rotatably mounted to a shaft 4j of the socket body 4. The lever 24 thus constructed is provided on each side of the slide plate 8 of the first embodiment in such a manner that the slide plate 8 is sandwiched between the levers 24, which are connected with a shaft 25. Each lever 24 has a slot 24a, into which the shaft 19 is fitted. When the shaft 25 is pressed down in the direction of an arrow α by the mechanical device, the two slide bars 20 sandwiching the slide plate 8 therebetween are moved In a leftward direction as indicated by an arrow β.

Figure 16:
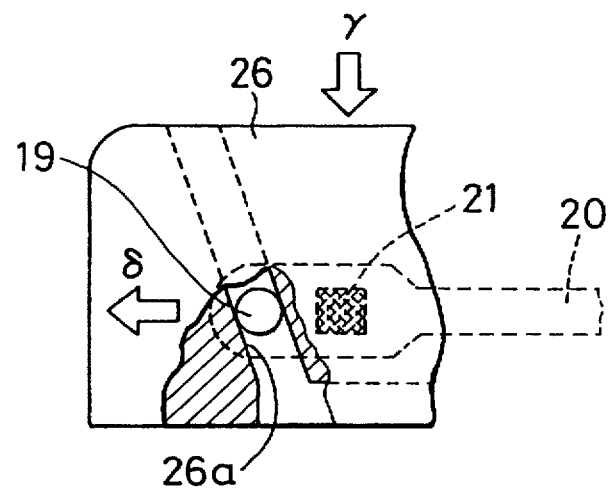
FIG. 16 is an explanatory view showing another modification example of the loading operation mechanism of the IC package in the first embodiment.

Another modification example of the loading operation mechanism shown in FIG. 16 is constructed so that a cover member 26 is provided with a cam groove 26a, in which the shaft 19 is put. The cam groove 26a is cut on each side of the cover member 26, and is engaged with each end of the shaft 19. Hence, when the cover member 26 is pressed down in the direction of an arrow γ, the two slide bars 20 sandwiching the slide plate 8 therebetween are moved leftwardly as indicated by an arrow δ.

Second embodiment

Figure 17:
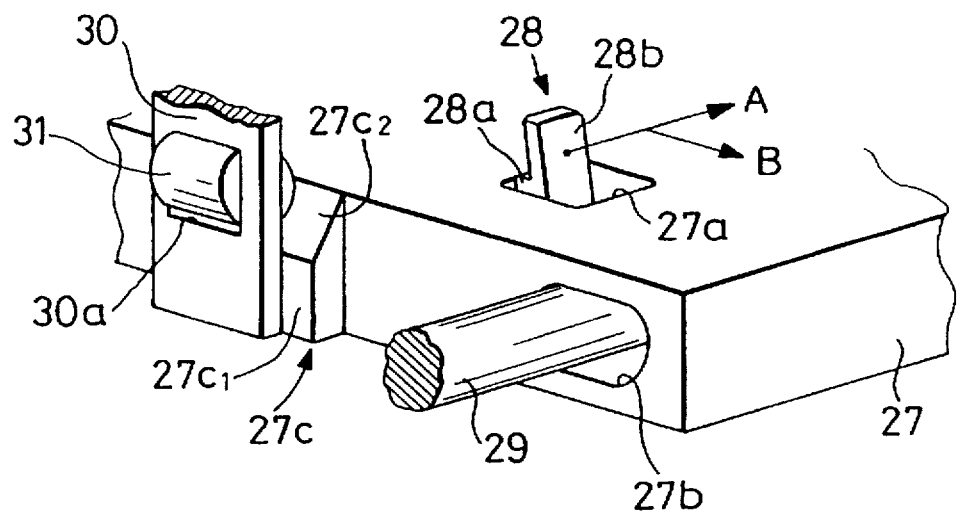
FIG. 17 is a perspective view showing the structure of a second embodiment of the IC socket according to the present invention.

This embodiment is adapted to operate each of the slide bars practically perpendicular to the plane of the slide plate, although the first embodiment is such as to operate each slide bar practically parallel thereto. Also, since the structure which is not explained here is substantially the same as that of the first embodiment, its detailed figure and description are omitted. In FIG. 17, a slide plate 27, as in the first embodiment, is placed to be movable in a horizontal direction on the socket body. A free end 28a of each of contact pins 28 is inserted in each of holes 27a bored through the slide plate 27, and a contact portion 28b of each contact pin 28 projects upwardly. The holes 27a, as in the first embodiment, are arranged in a plurality of rows so that the contact pins 28 are inserted therein.

The slide plate 27 is provided with a slot 27b, in which the shafts 29 is fitted. The operating mechanism of the shaft 29 is identical with the case of the first embodiment, and thus its figure is omitted. A tab 27c is provided on the side face of the slide plate 27 and has a parallel $27_{c1}$ parallel to the side face of the slide plate 27 and a slope $27_{c2}$. A slide bar 30 is constructed integral with the cover member, not shown, and can be moved vertically in accordance with the vertical movement of the cover member.

The slide bar 30 is provided with a hole 30a, in which a columnar rotator 31 is fitted. In this way, the rotator 31 is such that its axial movement is restrained by the hole 30a and its radial movement is restrained by contact with the side face of the socket body, not shown, and the slope $27_{c2}$. Also, although In FIG. 17 the slide bar 30 and the rotator 31 are shown by one set on one side face of the slide plate 27, two or more sets may be provided as in the first embodiment. Furthermore, the slide bar 30 holding the rotator 31, as well as a tab similar to the tab 27c, may be placed on the opposite side face of the slide plate 27 or, as described in the first embodiment, the resilient bodies may also be provided. In the case where the mechanism shown in FIG. 17 is used, however, it is needless to say that the slope of each of other tabs must be made parallel to the slope $27_{c2}$.

Subsequently, the loading operation of the BGA in the second embodiment will be briefly explained. When the cover member, not shown, is pressed down, for example, by the mechanical device, the slide bar 30 is lowered. At the same time, the shaft 29 is moved in the direction of the lower right in the figure by the link mechanism shown in the first embodiment, but in the initial operation, it is merely moved in the slot 27b and does not push the slide plate 27. On the other hand, the rotator 31 is also lowered by the downward movement of the slide bar 30 to push the slope $27_{c2}$. Consequently, the slide plate 27 is moved, and the contact pin 28 is urged, against its resilience, in the direction of an arrow A by the hole 27a. The movement of the slide plate 27 is completed when the rotator 31 contacts the parallel $27_{c1}$.

Hence, even though the slide bar 30 is further pressed down, a predetermined amount of movement will be derived, irrespective of the amount of downward movement.

After the movement of the slide plate 27 in the direction of the arrow A is completed, the shaft 29 comes in contact with the longitudinal inner wall of the slot 27b to push the slide plate 27 in the direction of an arrow B. The slide plate 27 is thus operated so that the contact pin 28 is moved, against its resilience, in the direction of the arrow B by the hole 27a, and then stops at a predetermined position. In this state, the BGA is inserted in the socket body. When the downward pressure of the cover member by the mechanical device is released progressively, the shaft 29 is moved in the direction opposite to the arrow B.

In accordance with such movement, the contact pin 28 is moved in the reverse direction of the arrow B by pushing the slide plate 27 in virtue of its own resilience. When the contact portion 28b of the contact pin 28 contacts the solder ball of the BGA, the slide plate 27 stops temporarily. After that, however, since the shaft 29 contacts the longitudinal inner wall of the slot 27b to further push the slide plate 27 in the reverse direction of the arrow B, the inner wall of the hole. 27a is separated from a free end 28a of the contact pin 28, and the slide plate 27 stops. At this time, the rotator 31 is still in contact with the side wall of the socket body and the parallel $27_{c1}$ of the tab 27c.

Subsequently, when the downward pressure of the cover member is further released and the slide bar 30 is raised, the rotator 31 will contact the slope $27_{c2}$, and therefore the slide plate 27 begins to move in the direction opposite to the arrow A. Consequently, the contact pin 28 follows the reverse direction of the arrow A in virtue of its own resilience, and wipes the solder ball through the contact portion 28b in accordance with a predetermined amount of movement before it stops. In order to remove the BGA from the socket body after the BGA is loaded and tested in this way, it is only necessary that, as described above, the cover member is pressed down by the mechanical device and the contact portion 28b of the contact pin 28 is separated from the solder ball.

Third embodiment

Figure 18:
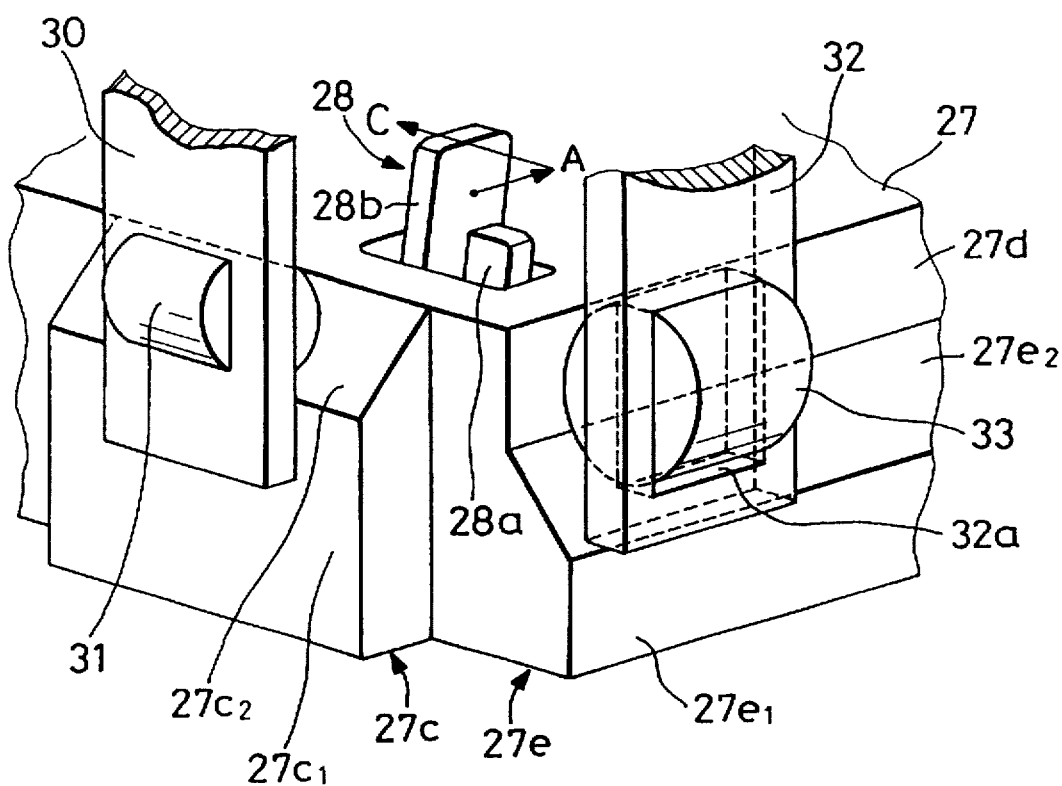
FIG. 18 is a perspective view showing the structure of a third embodiment of the IC socket according to the present invention.

Using FIG. 18, this embodiment is explained. Although the second embodiment uses the shaft 29 to move the slide plate 27 in the direction normal to that of the arrow A, the third embodiment employs a slide bar and a rotator as another set. Like numerals are used for like parts and portions as in FIG. 17 and their explanation is omitted. The slide plate 27 has a tab 27e on a side face 27d perpendicular to the side face provided with the tab 27c. The tab 27e is configured with a parallel $27_{e1}$ parallel to the side face 27d and a slope $27_{e2}$.

A slide bar 32 has the same structure as the slide bar 30, so that a columnar rotator 33 is fitted in a hole 32a. The slide bar 32 is constructed integral with the cover member, not shown, and the rotator 33 is such that its axial movement is restrained by the hole 32a and its radial movement is restrained by contact with the side wall of the socket body, not shown, and the side wall 27d in the figure. The orientation of the contact pin 28 is reversed with respect to the case of the second embodiment.

Next, the loading operation of the BGA in the third embodiment will be briefly explained. When the cover member, not shown, is pressed down by the mechanical device, the slide bars 30 and 32 are lowered. This first causes the rotator 31 to move the slide plate 27 in the direction of the arrow A. Thus, the contact pin 28 is urged against its resilience in the same direction. When the rotator 31 contacts the parallel $27_{c1}$ and thereby the movement of the slide plate 27 in the direction of the arrow A is completed, the rotator 33 then contacts the slope $27_{e2}$ to push the slide plate 27 in the direction of an arrow C. Therefore, the free end 28a of the contact pin 28 is pushed, and the contact pin 28 is moved, against its own resilience, by a predetermined amount in the same direction and then stops when the rotator 33 contacts the parallel $27_{e1}$.

In this state, when the BGA is inserted and the downward pressure of the cover member by the mechanical device is released progressively, the rotator 33 first contacts the slope $27_{e2}$. Consequently, the contact pin 28 pushes the slide plate 27 in virtue of its own resilience and is moved in a direction opposite to the arrow C. When the contact portion 28b of the contact pin 28 contacts the solder ball of the BGA, the slide plate 27 ceases to move. The rotator 33 is thus moved upwardly, eventually without contacting the lower end of the slope $27_{e2}$.

After that, when the rotator 31 contacts the slope $27_{c2}$, the slide plate 27 begins to move in a direction opposite to the arrow A. Thus, the contact pin 28 follows the direction opposite to the arrow A in virtue of its own resilience and wipes the solder ball through the contact portion 28b in accordance with a predetermined amount of movement before it stops. In order to remove the BGA from the socket body after the BGA is loaded and tested, it is merely necessary that the cover member is pressed down by the mechanical device, as mentioned above.

What is claimed is:

1. An IC socket comprising:

a cover member having an opening for inserting an IC package, mounted to be movable in a vertical direction with respect to a socket body;

mounting means for placing said IC package, fixed to said socket body;

a slide member of substantially rectangular shape having a plurality of holes in which contact pins are inserted, placed to be movable in a horizontal direction on an underside of said mounting means;

an operating member located on at least one of a set of parallel side faces of said slide member, reciprocating in a plane substantially parallel to said at least one side face in accordance with a vertical movement of said cover member; and position control means coming in contact with said at least one side face of said slide member, said position control means moved in a direction perpendicular to said at least one side face by said operating member in one stroke of a reciprocation of said operating member to press and move said slide member in the direction perpendicular to said at least one side face, and releasing a pressure from said slide member in a remaining stroke of the reciprocation to enable said slide member to regain an original position thereof.

2. An IC socket according to claim 1, wherein said operating member and said position control means are located on each of the set of parallel side faces of said slide member so that a forward motion of a reciprocation of a first operating member placed on one side face of said slide member causes first position control means placed on the one side face of said slide member to press and move the slide member in the direction perpendicular to the side face, while a backward motion of a reciprocation of a second operating member placed on a remaining side face of said slide member causes second position control means placed on the remaining side face of said slide member to push back said slide member in the direction perpendicular to the side face.

3. An IC socket according to claim 1, wherein said operating member and said position control means are located on one of the set of parallel side faces of said slide member and said slide member is restored to the original position by resilience of the contact pins.

4. An IC socket according to claim 1, wherein said operating member and said position control means are located on one of the set of parallel side faces of said slide member and a resilient body for regaining the original position of said slide member is provided on at least one of a remaining side face of the slide member and a side of the socket body opposite thereto.

5. An IC socket according to any one of claims 1–4, wherein said operating member reciprocates horizontally in accordance with the vertical movement of said cover member.

6. An IC socket according to claim 1, wherein said operating member reciprocates vertically in accordance with the vertical movement of said cover member.

7. An IC socket according to claim 1, wherein said operating member reciprocating vertically in accordance with the vertical movement of said cover member and said position control means are placed on at least one of a set of parallel side faces of said slide member, and another operating member reciprocating vertically in accordance with the vertical movement of said cover member and another position control means are placed on at least one of another set of parallel side faces of said slide member.

8. An IC socket according to claim 5, wherein said operating member reciprocating horizontally is held by a first shaft disposed so that an axis thereof is approximately parallel to a plane of said slide member and perpendicular to a direction of movement of said operating member.

9. An IC socket according to claim 8, wherein after a downward movement of said cover member causes said position control means to press and move said slide member in a direction perpendicular to the side face of said slide member, said first shaft is moved to push said slide member in a direction of movement of said first shaft.

10. An IC socket according to claim 9, wherein said first shaft is provided in said slide member and is fitted in a slot bored along the direction of movement of said first shaft.

11. An IC socket according to claim 8, further comprising a pair of first links mounted to be rotatable, at one end of each link, on both side faces of said socket body parallel to the direction of movement of said operating member reciprocating horizontally; a pair of second links mounted to be rotatable, at one end of each link, to both ends of said first shaft; and a second shaft placed parallel to said first shaft so that a remaining end of each of said first links and a remaining end of each of said second links are mounted to be rotatable at each of both ends of said second shaft, said second shaft being operated in accordance with the vertical movement of said cover member.

12. An IC socket according to claim 5, wherein a surface of said position control means coming in contact with the side face of said slide member is shaped into either one of an arc form and a spherical form.

13. An IC socket according to claim 12, wherein said position control means is held by said operating member and comes in contact with either one of a recess and a jog constructed integral with said socket body and the side face of said slide member.

14. An IC socket according to claim 12, wherein said position control means comes in contact with said operating member and the side face of said slide member so that said operating member is moved slightly perpendicular to a direction in which said operating member is moved, by behavior of a jog constructed integral with said socket body and another jog provided on said operating member.

15. An IC socket according to claim 14, wherein said operating member is moved slightly perpendicular to a direction in which said operating member is moved, by behavior of a slope constructed integral with said socket body and another slope provided on said operating member.

16. An IC socket according to claim 14, wherein said operating member is provided with any one of a recess, a jog, and a hole on a surface contacting with said position control means so that a rotator is disposed between said socket body and said operating member.

17. An IC socket according to claim 5, wherein said position control means is a rotator.

18. An IC socket according to claim 1, wherein said operating member reciprocating horizontally in accordance with the vertical movement of said cover member and said position control means are placed on said at least one of the set of parallel side faces of said slide member, and another operating member reciprocating vertically in accordance with the vertical movement of said cover member and another position control means are placed on at least one of another set of parallel side faces of said slide member.

19. An IC socket according to claim 18, wherein after operating member reciprocating horizontally is held by a first shaft disposed so that an axis thereof is approximately parallel to a plane of said slide member and perpendicular to a direction of movement of said operating member.

20. An IC socket according to claim 19, wherein after a downward movement of said cover member causes said position control means to press and move said slide member in a direction perpendicular to the side face of said slide member, said first shaft is moved to push said slide member in a direction of movement of said first shaft.

21. An IC socket according to claim 20, wherein said first shaft is provided in said slide member and is fitted in a slot bored along the direction of movement of said first shaft.

22. An IC socket according to any one of claims 19, 20 or 21, further comprising a pair of first links mounted to be rotatable, at one end of each link, on both side faces of said socket body parallel to the direction of movement of said operating member reciprocating horizontally; a pair of second links mounted to be rotatable, at one end of each link, to both ends of said first shaft; and a second shaft placed parallel to said first shaft so that a remaining end of each of said first links and a remaining end of each of said second links are mounted to be rotatable at each of both ends of said second shaft, said second shaft being operated in accordance with the vertical movement of said cover member.

* * * * *